United States Patent
Yasoshima et al.

(10) Patent No.: US 11,500,022 B2
(45) Date of Patent: Nov. 15, 2022

(54) POWER SUPPLY SYSTEM

(71) Applicant: TOYOTA JIDOSHA KABUSHIKI KAISHA, Toyota (JP)

(72) Inventors: Juni Yasoshima, Toyota (JP); Junta Izumi, Nagoya (JP); Kenji Kimura, Miyoshi (JP); Toshihiro Katsuda, Toyota (JP); Kohei Matsuura, Anjo (JP); Junichi Matsumoto, Toyota (JP); Shuji Tomura, Nagakute (JP); Shigeaki Goto, Nagakute (JP); Naoki Yanagizawa, Nagakute (JP); Kyosuke Tanemura, Nagakute (JP); Kazuo Ootsuka, Nagakute (JP); Takayuki Ban, Nishio (JP); Hironobu Nishi, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 580 days.

(21) Appl. No.: 16/685,153

(22) Filed: Nov. 15, 2019

(65) Prior Publication Data
US 2020/0166576 A1 May 28, 2020

(30) Foreign Application Priority Data
Nov. 28, 2018 (JP) .............................. JP2018-222767

(51) Int. Cl.
*G01R 31/36* (2020.01)
*H01M 10/42* (2006.01)
(Continued)

(52) U.S. Cl.
CPC .......... *G01R 31/36* (2013.01); *H01M 10/425* (2013.01); *H01M 10/4207* (2013.01);
(Continued)

(58) Field of Classification Search
USPC ....................................................... 320/134
See application file for complete search history.

(56) References Cited

U.S. PATENT DOCUMENTS

| 2011/0313613 | A1* | 12/2011 | Kawahara | ................. | B60L 3/04 |
| | | | | | 320/134 |
| 2014/0015522 | A1* | 1/2014 | Widmer | ................. | B60L 53/12 |
| | | | | | 324/239 |

(Continued)

FOREIGN PATENT DOCUMENTS

| JP | 2008-306782 A | 12/2008 |
| JP | 2012-043581 A | 3/2012 |

(Continued)

OTHER PUBLICATIONS

U.S. Appl. No. 16/686,341, filed Nov. 18, 2019 in the name of Juni Yasoshima et al.

(Continued)

*Primary Examiner* — Mohammed Alam
(74) *Attorney, Agent, or Firm* — Oliff PLC

(57) ABSTRACT

A power supply system includes a plurality of sweep modules, a defect detecting unit, and a control unit. Each sweep module includes a battery module and a power circuit module. The defect detecting unit detects a defect for each sweep module. The number of sweep modules is greater S (S≥2) than a minimum number of sweep modules required for operation. When the number of defective sweep modules in which a defect has been detected is equal to or less than F (2≤F≤S), the control unit is configured to disconnect the defective sweep modules from a main line and to continuously execute sweep control.

3 Claims, 5 Drawing Sheets

(51) Int. Cl.
    *H02J 9/04*    (2006.01)
    *H01M 10/48*   (2006.01)
    *H01M 10/44*   (2006.01)

(52) U.S. Cl.
    CPC ....... *H01M 10/441* (2013.01); *H01M 10/482* (2013.01); *H02J 9/04* (2013.01)

(56) References Cited

U.S. PATENT DOCUMENTS

2020/0169082 A1* 5/2020 Yasoshima ............ H02J 7/0013
2020/0177178 A1* 6/2020 Yasoshima .......... H01M 10/482

FOREIGN PATENT DOCUMENTS

| JP | 2018-074709 A | 5/2018 |
| JP | 2018-182782 A | 11/2018 |
| WO | 2010/109956 A1 | 9/2010 |
| WO | 2018/079664 A1 | 5/2018 |

OTHER PUBLICATIONS

U.S. Appl. No. 16/680,870, filed Nov. 12, 2019 in the name of Juni Yasoshima et al.
U.S. Appl. No. 16/684,734, filed Nov. 15, 2019 in the name of Juni Yasoshima et al.
U.S. Appl. No. 16/686,579, filed Nov. 18, 2019 in the name of Juni Yasoshima et al.
U.S. Appl. No. 16/692,223, filed Nov. 22, 2019 in the name of Juni Yasoshima et al.
U.S. Appl. No. 16/686,435, filed Nov. 18, 2019 in the name of Juni Yasoshima et al.
U.S. Appl. No. 16/690,252, filed Nov. 21, 2019 in the name of Juni Yasoshima et al.
U.S. Appl. No. 16/682,125, filed Nov. 13, 2019 in the name of Juni Yasoshima et al.

* cited by examiner

POWER SUPPLY SYSTEM

INCORPORATION BY REFERENCE

The disclosure of Japanese Patent Application No. 2018-222767 filed on Nov. 28, 2018 including the specification, drawings and abstract is incorporated herein by reference in its entirety.

BACKGROUND

1. Technical Field

The disclosure relates to a power supply system including a plurality of modules each of which includes a battery and a circuit.

2. Description of Related Art

A power supply device that includes a plurality of modules of which each includes a battery and a circuit and performs at least one of outputting of electric power to the outside and storage of electric power which is input from the outside by controlling the plurality of modules is known. For example, a power supply device described in Japanese Patent Application Publication No. 2018-74709 (JP 2018-74709 A) includes a plurality of battery circuit modules of which each includes a battery, a first switching element, and a second switching element. The plurality of battery circuit modules are connected in series with output terminals interposed therebetween. A control circuit of the power supply device outputs a gate signal for switching the first switching element and the second switching element between ON and OFF to the battery circuit modules at intervals of a predetermined time. Accordingly, a target electric power is output from the plurality of battery circuit modules.

SUMMARY

In a power supply system including a plurality of modules, a defect may be generated in some of the plurality of modules. Elements (for example, a battery) of a module in which a defect is generated need to be subjected to exchange, repair, or the like, but it is troublesome to perform exchange, repair, or the like whenever a defect is generated in one module. Accordingly, it is preferable to minimize a frequency of exchange, repair, or the like.

The disclosure provides a power supply system that can appropriately decrease a frequency of replacement, repair, or the like of an element having a defect.

According to an aspect of the disclosure, there is provided a power supply system including: a main line; a plurality of sweep modules that is connected to the main line; a defect detecting unit; and a control unit. Each sweep module includes a battery module that includes at least one battery and a power circuit module that includes at least one switching element that switches between connection and disconnection between the battery module and the main line. The defect detecting unit is configured to detect a defect for each sweep module. The sweep modules which are more S ($S \geq 2$) than a minimum number of sweep modules required for operation are connected to the main line. The control unit is configured to perform a first process of executing sweep control for sequentially switching the battery modules which are to be connected to the main line out of the plurality of battery modules by outputting a gate signal for controlling the switching element to the power circuit module, and a second process of excluding a sweep module in which a defect has been detected from the plurality of sweep modules and continuously executing the sweep control while maintaining disconnection of a sweep module in which a defect has been detected from the main line when the number of sweep modules in which a defect has been detected by the defect detecting unit out of the plurality of sweep modules connected to the main line is equal to or less than F ($2 \leq F \leq S$).

In the power supply system having the above-mentioned configuration, sweep modules of which the number is more 2 or more (S) than the minimum number of defective sweep modules required for operation are connected to one main line. When the number of sweep modules in which a defect has been detected is equal to or less than F ($2 \leq F \leq S$), the control unit excludes the defective sweep module and continues to execute sweep control. The value of F is set such that the minimum number of sweep modules required for operation (for example, operation by sweep control) is secured even when a defect has occurred in F sweep modules. Accordingly, even when defective sweep modules of which the number is equal to or less than F are generated, sweep control can continue to be appropriately executed.

When the number of defective sweep modules is equal to or less than F ($2 \leq F \leq S$), the control unit continues to disconnect the battery modules of the defective sweep modules from the main line in a state in which sweep control is being executed. In a sweep module in which the battery module continues to be disconnected from the main line, replacement, repair, or the like of elements (for example, replacement of a battery module with a defect) can be safely performed. That is, with the power supply system having the above-mentioned configuration, when the number of defective sweep modules is equal to or less than F, replacement, repair, adjustment, or the like (that is, maintenance) of elements of the sweep modules with a defect is appropriately performed in a state in which sweep control is being executed as a whole.

Here, the value of F is set to be equal to or greater than 2. Accordingly, until the number of defective sweep modules becomes greater than F ($F \geq 2$), maintenance of a defective sweep module can be performed at any time in a state in which sweep control is being executed as a whole. For example, maintenance of two or more defective sweep modules may be performed in a bundle in a state in which sweep control is being executed. That is, it is not necessary to perform maintenance whenever a defective sweep module occurs. Accordingly, with the power supply system having the above-mentioned configuration, the frequency of execution of maintenance of a defective sweep module decreases appropriately.

In the power supply system according to the aspect, the control unit may be configured to stop the sweep control when the number of sweep modules in which a defect has been detected out of the plurality of sweep modules connected to the main line is greater than F. In this case, a likelihood that operation will be inadequately performed in a state in which the number of normal sweep modules is small decreases.

The power supply system according to the aspect may further include an indicator configured to indicate a sweep module in which a defect has been detected. The control unit may cause the indicator to indicate a sweep module in which a defect has been detected by the defect detecting unit. In this case, an operator can easily ascertain a sweep module in which a defect has occurred using the indicator. Accordingly, it is possible to more appropriately perform maintenance of a sweep module in which a defect occurs.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
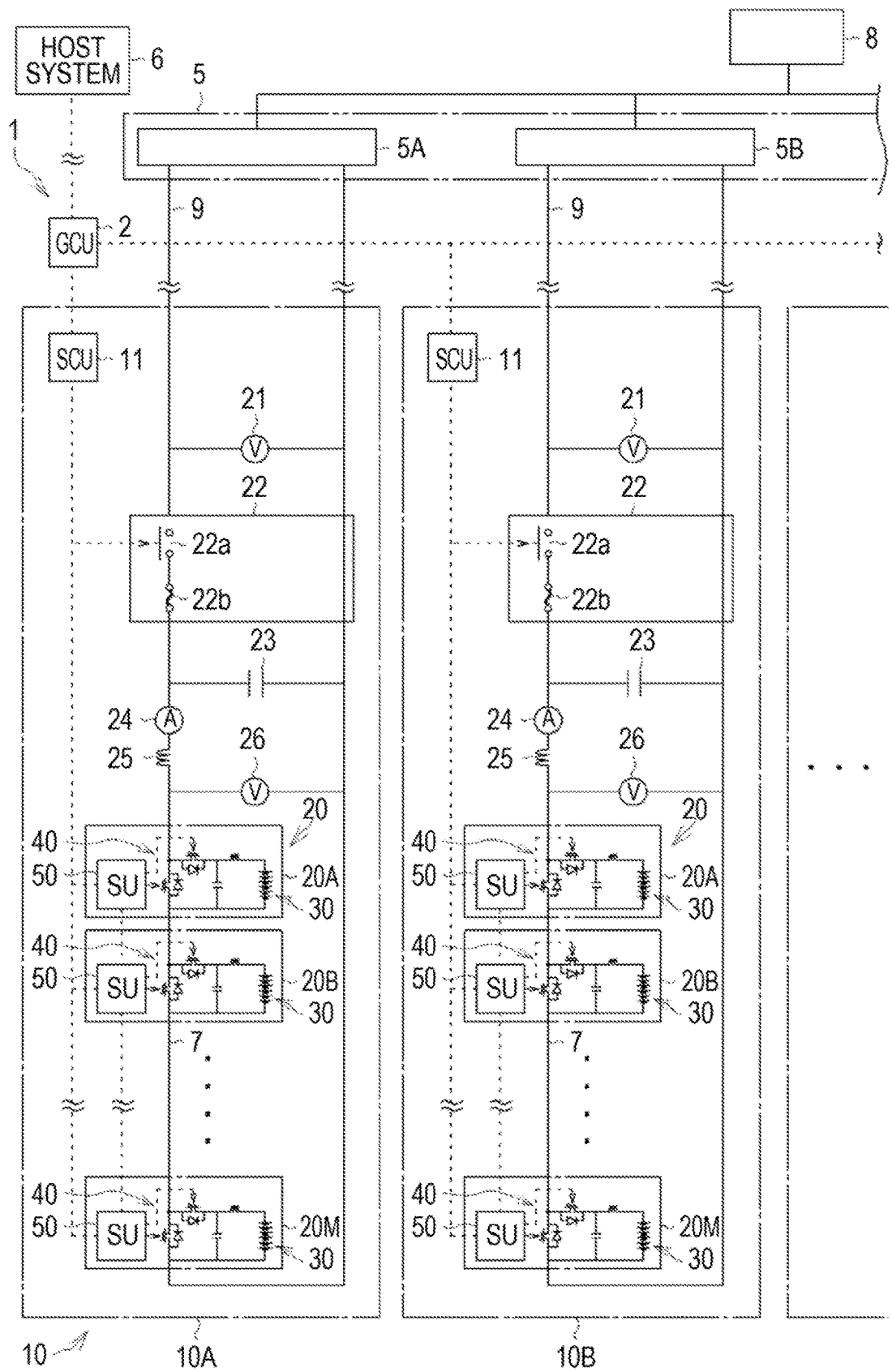
FIG. 1 is a diagram schematically illustrating a configuration of a power supply system 1.

Hereinafter, an exemplary embodiment of the present disclosure will be described in detail with reference to the accompanying drawings. Details which are not particularly mentioned in this specification and which are required for embodiment can be understood as design details based on the related art by those skilled in the art. The disclosure can be embodied based on details described in this specification and common general technical knowledge in the art. In the following drawings, members and parts performing the same operations will be referred to by the same reference signs. The dimensional relationships in the drawings do not reflect actual dimensional relationships.

Overall Schematic Configuration

The entire configuration of a power supply system 1 according to an embodiment will be schematically described below with reference to FIG. 1. The power supply system 1 performs at least one of outputting of electric power to a power distribution device 5 which is connected to a host power system 8 and storage of electric power which is input from the power distribution device 5 (hereinafter simply referred to as "inputting and outputting of electric power"). For example, in this embodiment, a power conditioning subsystem (PCS) is used as the power distribution device 5. The PCS has a function of converting electric power input from the power system 8 to the power supply system 1 or the like and electric power output from the power supply system 1 or the like to the power system 8 between the power supply system 1 or the like and the power system 8.

When electric power is surplus to the power system 8, the power distribution device 5 outputs the surplus electric power to the power supply system 1. In this case, the power supply system 1 stores electric power which is input from the power distribution device 5. The power supply system 1 outputs electric power stored in the power supply system 1 to the power distribution device 5 in accordance with an instruction from a host system 6 that controls the host power system 8. In FIG. 1, the host system 6 is a system that controls the power system 8 and the power distribution device 5 and is provided separately from the power system 8 and the power distribution device 5. However, the host system 6 may be incorporated into the power system 8 or the power distribution device 5.

The power supply system 1 includes one or more strings 10. The power supply system 1 according to this embodiment includes a plurality of (N: N≥2) strings 10 (10A, 10B, . . . , 10N). In FIG. 1, for the purpose of convenience, only two strings 10A and 10B out of the N strings 10 are illustrated. Each string 10 serves as a unit for inputting and outputting electric power to and from the power distribution device 5. The plurality of strings 10 is connected in parallel to the power distribution device 5. Inputting and outputting (power supply) of electric power between the power distribution device 5 and each string 10 is performed via a main line 7.

Each string 10 includes a string control unit (SCU) 11 and a plurality of (M: M≥2) sweep modules 20 (20A, 20B, . . . , 20M). Each sweep module 20 includes a battery and a control circuit. The SCU 11 is provided for each string 10. The SCU 11 is a controller that comprehensively controls the plurality of sweep modules 20 included in the corresponding string 10. Each SCU 11 communicates with a group control unit (GCU) 2 serving as a power control device. The GCU 2 is a controller that comprehensively controls a group including the plurality of strings 10 as a whole. The GCU 2 communicates with the host system 6 and the SCUs 11. Various methods (for example, at least one of wired communication, wireless communication, and communication via a network) can be employed as a method of communication between the host system 6, the GCU 2, and the SCUs 11.

The configuration of the controllers that control the strings 10, the sweep modules 20, and the like may be modified. For example, the GCU 2 and the SCUs 11 may not be separately provided. That is, one controller may control the whole group including one or more strings 10 and all the plurality of sweep modules 20 included in the string 10.

Sweep Module

A sweep module 20 will be described below in detail with reference to FIG. 2. The sweep module 20 includes a battery module 30, a power circuit module 40, and a sweep unit (SU) 50.

The battery module 30 includes at least one battery 31. A plurality of batteries 31 is provided in the battery module 30 according to this embodiment. The plurality of batteries 31 is connected in series. In this embodiment, a secondary battery is used as each battery 31. At least one of various secondary batteries (for example, a nickel-hydride battery, a lithium ion battery, and a nickel-cadmium battery) can be used as the battery 31. In the power supply system 1, a plurality of types of batteries 31 may be mixed. The types of the batteries 31 in all the battery modules 30 may be the same.

A voltage detecting unit 35 and a temperature detecting unit 36 are provided in the battery module 30. The voltage detecting unit 35 detects a voltage of the batteries 31 in the battery module 30 (the plurality of batteries 31 connected in series in this embodiment). The temperature detecting unit 36 detects a temperature of the batteries 31 in the battery module 30 or a temperature near the batteries 31. Various devices (for example, a thermistor) that detect a temperature can be used as the temperature detecting unit 36.

The battery module 30 is provided to be attached to and detached from the power circuit module 40. Specifically, in this embodiment, with the battery module 30 including a plurality of batteries 31 as one unit, detachment of the battery module 30 from the power circuit module 40 and attachment thereof to the power circuit module 40 are performed. Accordingly, in comparison with a case in which the batteries 31 in the battery module 30 are replaced one by one, the number of operation steps when an operator replaces the batteries 31 decreases. In this embodiment, the voltage detecting unit 35 and the temperature detecting unit 36 are replaced separately from the battery module 30. However, at least one of the voltage detecting unit 35 and the temperature detecting unit 36 may be replaced along with the battery module 30.

The power circuit module 40 forms a circuit for appropriately realizing inputting and outputting of electric power in the battery module 30. In this embodiment, the power circuit module 40 includes at least one switching element that switches between connection and disconnection between the battery module 30 and the main line 7. In this embodiment, the power circuit module 40 includes an input and output circuit 43 that connects the battery module 30 to the main line 7 and a first switching element 41 and a second switching element 42 that are provided in the input and output circuit 43. The first switching element 41 and the second switching element 42 perform a switching operation in accordance with a signal (for example, a gate signal) which is input form the sweep unit 50.

Figure 2:
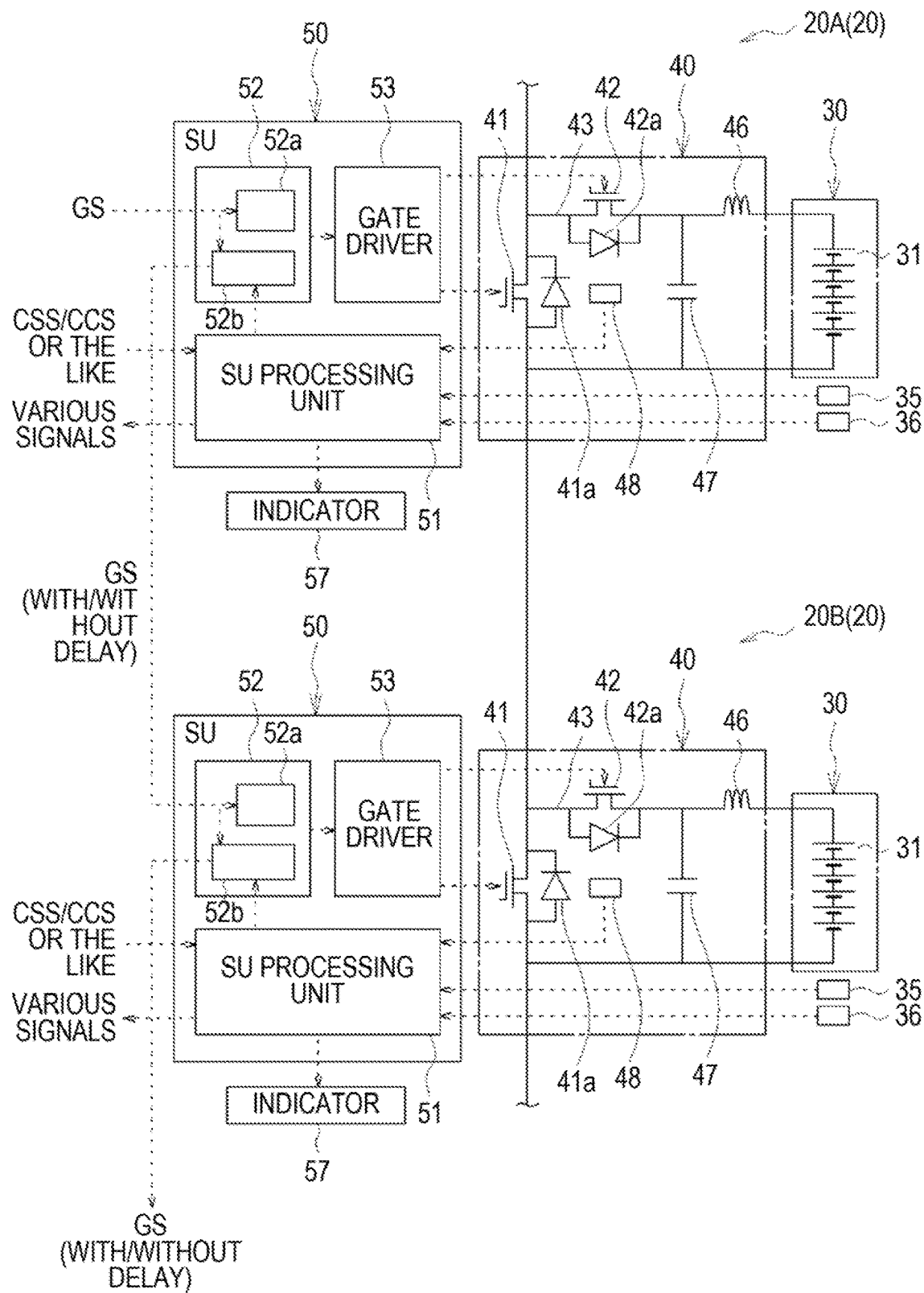
FIG. 2 is a diagram schematically illustrating a configuration of a sweep module 20.

In this embodiment, as illustrated in FIG. 2, the first switching element 41 is attached in series to the main line 7 and in parallel to the battery module 30 in the input and output circuit 43. The second switching element 42 is attached to a part of the input and output circuit 43 that connects the battery module 30 in series to the main line 7. A source and a drain of the first switching element 41 are disposed such that a forward direction thereof is set to a direction in which a discharging current flows in the main line 7. A source and a drain of the second switching element 42 are disposed in the input and output circuit 43 attaching the battery module 30 in series to the main line 7 such that a forward direction thereof is set to a direction in which a charging current flows in the battery module 30. In this embodiment, the first switching element 41 and the second switching element 42 are MOSFETs (for example, Si-MOSFETs) and include body diodes 41a and 42a, respectively, set to a forward direction. Here, the body diode 41a of the first switching element 41 can be appropriately referred to as a first body diode. The body diode 42a of the second switching element 42 can be appropriately referred to as a second body diode.

The first switching element 41 and the second switching element 42 are not limited to the example illustrated in FIG. 2. Various elements that can switch between connection and disconnection can be used as the first switching element 41 and the second switching element 42. In this embodiment, a MOSFET (specifically an Si-MOSFET) is used as both the first switching element 41 and the second switching element 42. However, an element (for example, a transistor) other than a MOSFET may be employed.

The power circuit module 40 includes an inductor 46 and a capacitor 47. The inductor 46 is provided between the battery module 30 and the second switching element 42. The capacitor 47 is connected in parallel to the battery module 30. In this embodiment, since secondary batteries are used as the batteries 31 of the battery module 30, it is necessary to curb deterioration of the batteries 31 due to an increase in internal resistance loss. Accordingly, by forming an RLC filter using the battery module 30, the inductor 46, and the capacitor 47, equalization of a current is achieved.

A temperature detecting unit 48 is provided in the power circuit module 40. The temperature detecting unit 48 is provided to detect emission of heat from at least one of the first switching element 41 and the second switching element 42. In this embodiment, the first switching element 41, the second switching element 42, and the temperature detecting unit 48 are assembled into one base. Accordingly, the base is replaced at a time point at which a defect of one of the first switching element 41 and the second switching element 42 has been detected. Accordingly, in this embodiment, by providing one temperature detecting unit 48 near the first switching element 41 and the second switching element 42, it is possible to decrease the number of components. Here, a temperature detecting unit that detects the temperature of the first switching element 41 and a temperature detecting unit that detects the temperature of the second switching element 42 may be provided separately from each other. Various devices (for example, a thermistor) that detect a temperature can be used as the temperature detecting unit 48.

As illustrated in FIGS. 1 and 2, a plurality of battery modules 30 in the string 10 are connected in series to the main line 7 with the power circuit modules 40 interposed therebetween. By appropriately controlling the first switching element 41 and the second switching element 42 of each power circuit module 40, the corresponding battery module 30 is connected to the main line 7 or is disconnected from the main line 7. In the example of the configuration of the power circuit module 40 illustrated in FIG. 2, when the first switching element 41 is turned off and the second switching element 42 is turned on, the battery module 30 is connected to the main line 7. When the first switching element 41 is turned on and the second switching element 42 is turned off, the battery module 30 is disconnected from the main line 7.

The sweep unit (SU) 50 is a control unit that is incorporated into the sweep module 20 such that various controls associated with the sweep module 20 are executed, and is also referred to as a sweep control unit. Specifically, the sweep unit 50 outputs a signal for driving the first switching element 41 and the second switching element 42 in the power circuit module 40. The sweep unit 50 notifies a host controller (the SCU 11 illustrated in FIG. 1 in this embodiment) of states of the sweep module 20 (for example, the voltage of the battery module 30, the temperature of the batteries 31, and the temperature of the switching elements 41 and 42). The sweep unit 50 is incorporated into each of a plurality of sweep modules 20 of each string 10. The sweep units 50 incorporated into the plurality of sweep modules 20 of each string 10 are sequentially connected to each other and are configured to allow a gate signal GS which is output from the SCU 11 to propagate sequentially. As illustrated in FIG. 2, in this embodiment, each sweep unit 50 includes an SU processing unit 51, a delay/selection circuit 52, and a gate driver 53.

The SU processing unit 51 is a controller that takes charge of various processes in the sweep unit 50. For example, a microcomputer can be used as the SU processing unit 51. Detection signals from the voltage detecting unit 35, the temperature detecting unit 36, and the temperature detecting unit 48 are input to the SU processing unit 51. The SU processing unit 51 performs inputting and outputting various signals to and from a host controller (the SCU 11 of the string 10 in this embodiment).

The signals which are input from the SCU 11 to the SU processing unit 51 include a forcible through signal CSS and a forcible connection signal CCS. The forcible through signal CSS is a signal for instructing to disconnect the battery module 30 from the main line 7 (see FIG. 1) extending from the power distribution device 5 to the string 10. That is, the sweep module 20 to which the forcible through signal CSS is input ignores an operation for inputting and outputting electric power to and from the power distribution device 5. The forcible connection signal CCS is a signal for instructing to maintain connection of the battery module 30 to the main line 7.

A gate signal GS is input to the delay/selection circuit 52. The gate signal (a PWM signal in this embodiment) GS is a signal for controlling an alternate repeated switching operation between an ON state and an OFF state of the first switching element 41 and the second switching element 42. The gate signal GS is a pulse-shaped signal in which ON and OFF are alternately repeated. The gate signal GS is first input to the delay/selection circuit 52 in one sweep module 20 from the SCU 11 (see FIG. 1). Subsequently, the gate signal GS propagates sequentially from the delay/selection circuit 52 of one sweep module 20 to the delay/selection circuit 52 of another sweep module 20.

Figure 3:
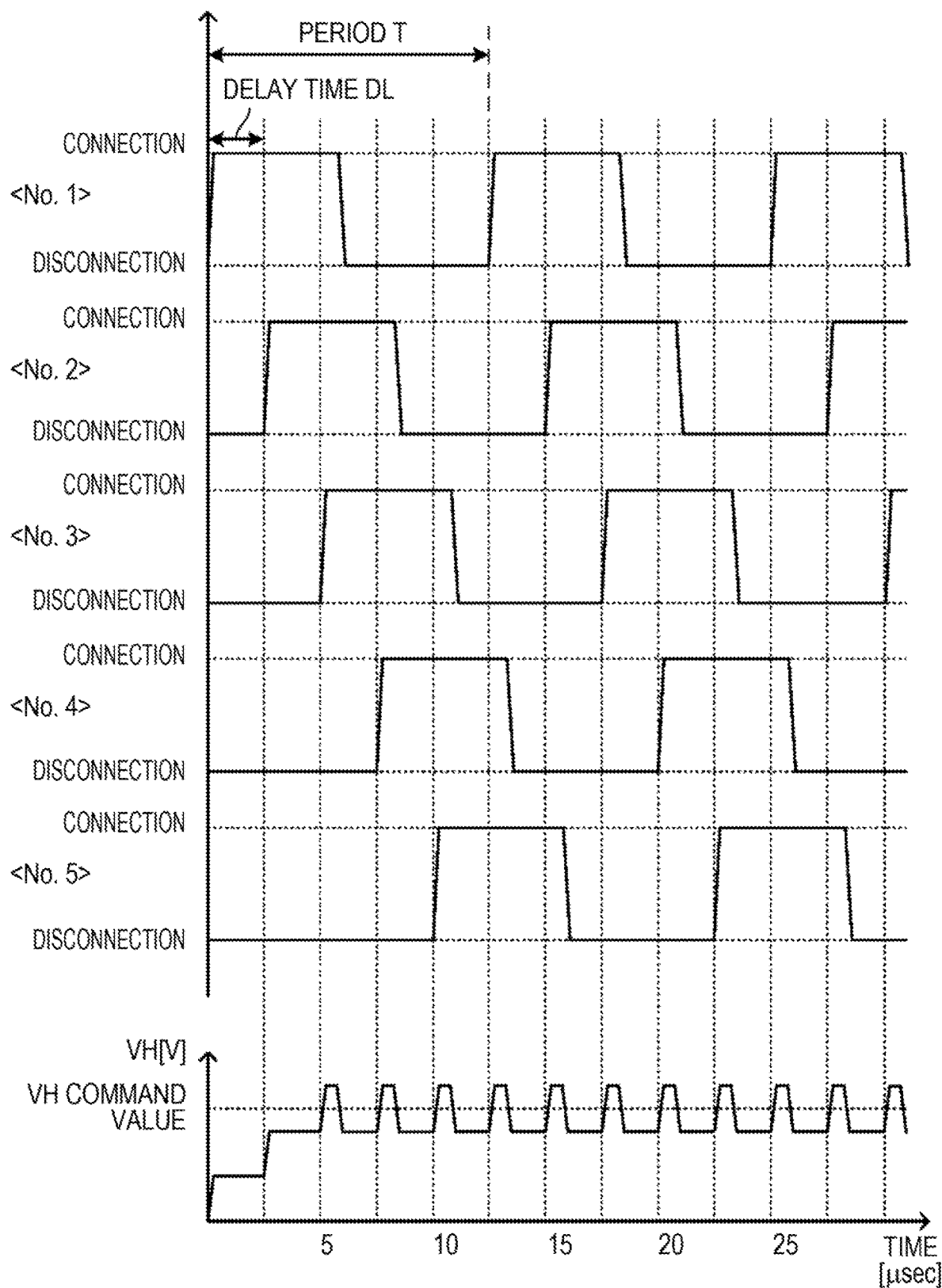
FIG. 3 is a timing chart illustrating an example of a sweep operation.
Figure 4:
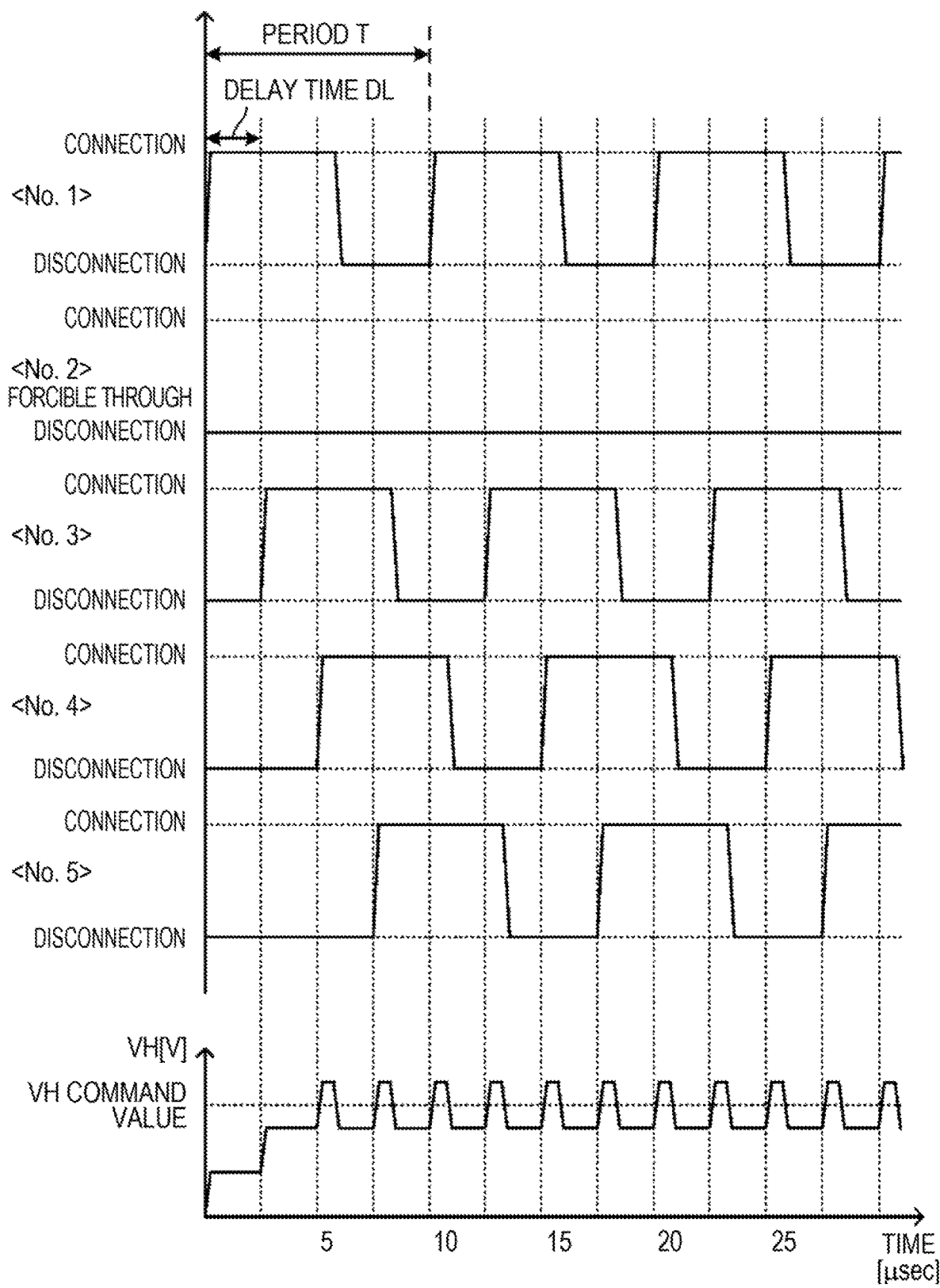
FIG. 4 is a timing chart illustrating an example of a forcible through operation.

In each string 10, sweep control which is illustrated in FIGS. 3 and 4 is executed. Here, FIG. 3 is a timing chart illustrating an example of a sweep operation. Specifically, in FIG. 3, a relationship between a connection state of the sweep modules 20 and a voltage output to the power distribution device 5 when all the sweep modules 20 execute the sweep operation is illustrated as an example. FIG. 4 is a timing chart illustrating an example of a forcible through operation. Specifically, in FIG. 4, a relationship between a connection state of the sweep modules 20 and a voltage output to the power distribution device 5 when some sweep modules 20 execute the forcible through operation is illustrated as an example.

In sweep control which is executed in each string 10, the number m of sweep modules 20 which are turned on at the same time out of a plurality of (for example, M) sweep modules 20 incorporated into the string 10 is determined. The gate signal GS in sweep control has, for example, a pulse-shaped waveform. In the gate signal GS, for example, a signal waveform for connecting the battery module 30 to the main line 7 and a signal waveform for disconnecting the battery module 30 from the main line 7 may be sequentially disposed. In the gate signal GS, the signal waveform for connecting the battery module 30 to the main line 7 may embed the number of battery modules 30 which are connected to the main line 7 in a predetermined period T in which the string 10 is swept. The signal waveform for disconnecting the battery module 30 from the main line 7 may embed the number of battery modules 30 which are to be disconnected from the main line 7 out of the battery modules 30 incorporated into the string 10. In the signal waveform for connecting the battery module 30 to the main line 7 and the signal waveform for disconnecting the battery module 30 from the main line 7, wavelengths thereof and the like are appropriately adjusted.

In each string 10 according to this embodiment, M sweep modules 20 are connected in series in the order of sweep modules 20A, 20B, . . . , 20M from the power distribution device 5. In the following description, a side which is close to the power distribution device 5 is defined as an upstream side, and a side which is distant from the power distribution device 5 is defined as a furthest downstream side. First, the gate signal GS is input from the SCU 11 to the delay/selection circuit 52 of the sweep unit 50 in the sweep module 20A which is furthest upstream. Subsequently, the gate signal GS propagates from the delay/selection circuit 52 of the sweep module 20A to the delay/selection circuit 52 of the sweep module 20B adjacent thereto downstream. Propagation of the gate signal to the sweep module 20 adjacent thereto downstream is sequentially repeated up to the sweep module 20M which is furthest downstream.

Here, the delay/selection circuit 52 can allow a pulse-shaped gate signal GS which is input from the SCU 11 or the upstream sweep module 20 to propagate to the downstream sweep module 20 with a delay of a predetermined delay time. In this case, a signal indicating the delay time is input from the SCU 11 to the sweep unit 50 (the SU processing unit 51 in the sweep unit 50 in this embodiment). The delay/selection circuit 52 delays the gate signal GS based on the delay time indicated by the signal. The delay/selection circuit 52 may allow the input gate signal GS to propagate to the downstream sweep module 20 without a delay.

The gate driver 53 drives the switching operations of the first switching element 41 and the second switching element 42. The delay/selection circuit 52 outputs a signal for controlling driving of the gate driver 53 to the gate driver 53. The gate driver 53 outputs control signals to the first switching element 41 and the second switching element 42. When the battery module 30 is to be connected to the main line 7, the gate driver 53 outputs a control signal for turning off the first switching element 41 and turning on the second switching element 42. When the battery module 30 is disconnected from the main line 7, the gate driver 53 outputs a control signal for turning on the first switching element 41 and the turning off the second switching element 42.

The delay/selection circuit 52 in this embodiment is controlled by a controller such as the SCU 11 and selectively performs a sweep operation, a forcible through operation, and a forcible connection operation.

For example, in the sweep operation, the first switching element 41 and the second switching element 42 are operated by the gate signal GS. A plurality of battery modules 30 included in the string 10 are connected to the main line 7 in a predetermined order and is disconnected from the main line 7 in a predetermined order. As a result, the string 10 is driven such that a predetermined number of battery modules 30 are normally connected to the main line 7 while sequentially changing the battery modules 30 connected to the main line 7 in a short control cycle. Through this sweep operation, the string 10 serves as one battery pack in which the predetermined number of battery modules 30 are connected in series while sequentially changing the battery modules 30 connected to the main line 7 in the short control cycle. The sweep modules 20 of the string 10 are controlled by the SCU 11 such that such a sweep operation is realized. In this control, the SCU 11 outputs the gate signal GS to the string 10 and outputs the control signal to the SU processing unit 51 incorporated into the sweep module 20. Details of an example of the sweep operation will be described later with reference to FIGS. 3 and 4.

In the sweep operation, the delay/selection circuit 52 outputs the input gate signal GS to the gate driver 53 without any change and causes the gate signal GS to propagate to a downstream sweep module 20 with a delay of a delay time. As a result, the battery modules 30 of the sweep modules 20 under the sweep operation are sequentially connected to the main line 7 and are sequentially disconnected from the main line 7 at different timings in the string 10.

In the forcible through operation, the delay/selection circuit 52 outputs a signal for maintaining the first switching element 41 in the ON state and maintaining the second switching element 42 in the OFF state to the gate driver 53 regardless of the input gate signal GS. As a result, the battery modules 30 of the sweep modules 20 under the forcible through operation are disconnected from the main line 7. The delay/selection circuit 52 of the sweep module 20 under the forcible through operation causes the gate signal GS to propagate the downstream sweep module 20 without a delay.

In the forcible connection operation, the delay/selection circuit 52 outputs a signal for maintaining the first switching element 41 in the OFF state and maintaining the second switching element 42 in the ON state to the gate driver 53 regardless of the input gate signal GS. As a result, the battery modules 30 of the sweep modules 20 under the forcible connection operation are normally connected to the main line 7. The delay/selection circuit 52 of the sweep module 20 under the forcible connection operation causes the gate signal GS to propagate the downstream sweep module 20 without a delay.

The delay/selection circuit 52 may be constituted as a single integrated circuit that performs the above-mentioned necessary functions. The delay/selection circuit 52 may be constituted in combination between a circuit that delays a gate signal GS and a circuit that selectively outputs a gate signal GS to the gate driver 53. An example of the configuration of the delay/selection circuit 52 in this embodiment will be described below.

In this embodiment, as illustrated in FIG. 2, the delay/selection circuit 52 includes a delay circuit 52a and a selection circuit 52b. The gate signal GS input to the delay/selection circuit 52 is input to the delay circuit 52a. The delay circuit 52a outputs the gate signal GS to the selection circuit 52b with a delay of a predetermined delay time. The gate signal GS input to the delay/selection circuit 52 is output to the selection circuit 52b via a separate route which does not pass through the delay circuit 52a without any change. The selection circuit 52b receives an instruction signal form the SU processing unit 51 and outputs the gate signal GS in accordance with the instruction signal.

When the instruction signal from the SU processing unit 51 instructs to perform a sweep operation, the selection circuit 52b outputs the input gate signal GS to the gate driver 53 of the sweep module 20 without any change. The gate driver 53 outputs a control signal to the power circuit module 40, turns off the first switching element 41, turns on the second switching element 42, and connects the battery module 30 to the main line 7. On the other hand, the selection circuit 52b outputs the gate signal GS with a delay to the delay/selection circuit 52 of the sweep module 20 adjacent thereto downstream. That is, when the battery module 30 is connected to the main line 7 in the sweep operation, the gate signal GS with a delay of a predetermined delay time is sent to the sweep module 20 adjacent thereto downstream.

When the instruction signal from the SU processing unit 51 is the forcible through signal CSS, the selection circuit 52b outputs a signal for ignoring the battery module 30 to the gate driver 53. By maintaining the forcible through signal CSS, the battery module 30 of the sweep module 20 receiving the forcible through signal CSS is maintained in a state in which it is disconnected from the main line 7. In this case, the selection circuit 52b outputs the gate signal GS, which is input to the selection circuit 52b via another route which does not pass through the delay circuit 52a, to the sweep module 20 adjacent thereto downstream.

When the instruction signal from the SU processing unit 51 is the forcible connection signal CCS, the selection circuit 52b outputs a signal for connecting the battery module 30 to the main line 7 to the gate driver 53. That is, the gate driver 53 turns off the first switching element 41, turns on the second switching element 42, and connects the battery module 30 to the main line 7. By maintaining the forcible connection signal CCS, the battery module 30 is maintained in a state in which it is connected to the main line 7. In this case, the selection circuit 52b outputs the gate signal GS, which is input to the selection circuit 52b via another route which does not pass through the delay circuit 52a, to the sweep module 20 adjacent thereto downstream.

As illustrated in FIGS. 1 and 2, in this embodiment, a plurality of sweep units 50 (specifically a plurality of delay/selection circuits 52) included in one string 10 is sequentially connected in a daisy chain manner. As a result, the gate signal GS input form the SCU 11 to one sweep unit 50 propagates sequentially to the plurality of sweep units 50. Accordingly, processes in the SCU 11 are likely to be simplified and an increase in signal properties is easily curbed. However, the SCU 11 may individually output the gate signal GS to the plurality of sweep units 50.

Each sweep unit 50 includes an indicator 57. The indicator 57 notifies an operator of, for example, a state of the sweep module 20 including a battery module 30 or a power circuit module 40. The indicator 57 can notify an operator, for example, that a defect in the battery module 30 of the sweep module 20 (for example, failure or deterioration of the batteries 31) has been detected (that is, the battery module 30 should be replaced).

For example, an LED which is a kind of light emitting device is used as the indicator 57 in this embodiment. However, a device (for example, a display) other than an LED may be used as the indicator 57. A device (for example, a speaker) that outputs voice may be used as the indicator 57. The indicator 57 may notify an operator of the state of the sweep module 20 by driving an actuator (for example, a motor or a solenoid). The indicator 57 may be configured to indicate the state using different methods depending on the state of the sweep module 20.

In this embodiment, the operation of the indicator 57 is controlled by the SU processing unit 51 of the sweep unit 50. However, a controller (for example, the SCU 11) other than the SU processing unit 51 may control the operation of the indicator 57.

In this embodiment, the indicator 57 is provided for each sweep unit 50. Accordingly, an operator can easily identify the sweep module 20 of which the state has been notified by the indicator 57 out of the plurality of sweep modules 20 which are arranged. However, the configuration of the indicator 57 may be modified. For example, separately from the indicator 57 disposed for each sweep unit 50 or along with the indicator 57, a state notifying unit that notifies the states of a plurality of sweep modules 20 in a bundle may be provided. In this case, for example, the state notifying unit may display the states of the plurality of sweep modules 20 (for example, whether a defect has occurred) on one monitor.

Sweep Control

Sweep control which is executed in a string 10 will be described below. Here, sweep control is control for causing each battery module 30 of the string 10 to perform a sweep operation. In sweep control which is executed in the string 10, the SCU 11 outputs a pulse-shaped gate signal GS. The switching elements 41 and 42 in a plurality of sweep modules 20 of the string 10 are driven to switch appropriately between ON and OFF. As a result, connection of the battery module 30 to the main line 7 and disconnection of the battery module 30 from the main line 7 are fast switched to each other for each sweep module 20. In the string 10, the gate signal GS which is input to an X-th sweep module 20 from upstream can be delayed with respect to the gate signal GS which is input to an (X−1)-th sweep module 20. As a result, m (m<M) sweep modules 20 connected to the main line 7 out of M sweep modules 20 in the string 10 are sequentially switched. Accordingly, a plurality of battery modules 30 included in the string 10 is connected to the main line 7 in a predetermined order and is disconnected from the main line in a predetermined order. A predetermined number of battery modules 30 can be normally connected to the main line 7. Through this sweep operation, the string 10 serves as a single battery pack in which a predetermined number of battery modules 30 are connected in series.

FIG. 3 is a timing chart illustrating an example of a relationship between connection states of sweep modules 20 and a voltage which is output to the power distribution device 5 when all the sweep modules 20 included in the string 10 are caused to perform the sweep operation. The number M of sweep modules 20 included in one string 10 can be appropriately changed. In the example illustrated in FIG. 3, five sweep modules 20 are included in one string 10 and all of the five sweep modules 20 are caused to perform the sweep operation.

In the example illustrated in FIG. 3, a VH command signal for setting a voltage VH [V] output to the power distribution device 5 to 100 V is input to the SCU 11 of the string 10. The voltage Vmod [V] of the battery module 30 in each sweep module 20 is 43.2 V. The delay time DL [μsec] by which a gate signal GS is delayed is appropriately set depending on the specification required for the power supply system 1. The period T of the gate signal GS (that is, the period in which a sweep module 20 is connected and disconnected) has a value which is obtained by multiplying the delay time DL by the number P of sweep modules 20 (≤M) which are to perform the sweep operation. Accordingly, when the delay time DL is set to be greater, the frequency of the gate signal GS becomes lower. On the other hand, when the delay time DL is set to be less, the frequency of the gate signal GS becomes higher. In the example, illustrated in FIG. 3, the delay time DL is set to 2.4 μsec. Accordingly, the period T of the gate signal GS is "2.4 μsec×5=12 μsec."

In this embodiment, a battery module 30 of a sweep module 20 in which the first switching element 41 is turned off and the second switching element 42 is turned on is connected to the main line 7. That is, when the first switching element 41 is turned off and the second switching element 42 is turned on, the capacitor 47 that is provided in parallel to the battery module 30 is connected to the input and output circuit 43 and electric power is input and output. The sweep unit 50 of the sweep module 20 connects the battery module 30 to the main line 7 while the gate signal GS is in the ON state. On the other hand, a battery module 30 of a sweep module 20 in which the first switching element 41 is turned on and the second switching element 42 is turned off is disconnected from the main line 7. The sweep unit 50 disconnects the battery module 30 from the main line 7 while the gate signal GS is in the OFF state.

When the first switching element 41 and the second switching element 42 are simultaneously turned on, a short-circuit occurs. Accordingly, when the first switching element 41 and the second switching element 42 are driven to switch, the sweep unit 50 switches one element from ON to OFF and switches the other element from OFF to ON after a slightly waiting time has elapsed thereafter. As a result, it is possible to prevent a short-circuit from occurring.

A VH command value which is instructed by a VH command signal is defined as VH_com, a voltage of each battery module 30 is defined as Vmod, and the number of sweep modules 20 which are to perform the sweep operation (that is, the number of sweep modules 20 which are to be connected to the main line 7 in sweep control) is defined as P. In this case, a duty ratio of an ON time to the period T in a gate signal GS is calculated as "VH_com/(Vmod×P)." In the example illustrated in FIG. 3, the duty ratio of the gate signal GS is about 0.46. Strictly, the duty ratio varies due to an influence of the waiting time for preventing occurrence of a short-circuit. Accordingly, the sweep unit 50 may perform correction of the duty ratio using a feedback process or a feedforward process.

As illustrated in FIG. 3, when sweep control is started, first, one of P sweep modules 20 (the sweep module 20 of No. 1 which is furthest upstream in the example illustrated in FIG. 3) is connected. Thereafter, when the delay time DL elapses, a next sweep module 20 (the sweep module 20 of No. 2 which is located the second from upstream in the example illustrated in FIG. 3) is connected. In this state, the voltage VH which is output to the power distribution device 5 is a sum value of the voltages of two sweep modules 20 and does not reach the VH command value. When the delay time DL elapses additionally, the sweep module 20 of No. 3 is connected. In this state, the number of sweep modules 20 connected to the main line 7 is three of Nos. 1 to 3. Accordingly, the voltage VH which is output to the power distribution device 5 is a sum value of the voltages of three sweep modules 20 and is greater than the VH command value. Thereafter, when the sweep module 20 of No. 1 is disconnected from the main line 7, the voltage VH returns to the sum value of the voltages of two sweep modules 20. When the delay time DL elapses after the sweep module of No. 3 has been connected, the sweep module 20 of No. 4 is connected. As a result, the number of sweep modules 20 which are connected to the main line 7 through sweep control are three of Nos. 2 to 4. As described above, m (three in FIG. 3) sweep modules 20 which are connected to the main line 7 out of M (five in FIG. 3) sweep modules 20 are sequentially switched.

As illustrated in FIG. 3, the VH command value may not be indivisible by the voltage Vmod of each battery module 30. In this case, the voltage VH which is output to the power distribution device 5 varies. However, the voltage VH is equalized by the RLC filter and is output to the power distribution device 5. Even when the battery modules 30 of the sweep modules 20 are charged with electric power which is input from the power distribution device 5, the connection states of the sweep modules 20 are controlled similarly to the timing chart illustrated in FIG. 3.

Forcible Through Operation

Control when some sweep modules 20 are caused to perform a forcible through operation and the other sweep modules 20 are caused to perform a sweep operation will be described below with reference to FIG. 4. As described above, the sweep module 20 which has been instructed to perform a forcible through operation maintains a state in which the battery module 30 is disconnected from the main line 7. The example illustrated in FIG. 4 is different from the example illustrated in FIG. 3 in that the sweep module 20 of No. 2 is caused to perform a forcible through operation. That is, in the example illustrated in FIG. 4, the number P of sweep modules 20 which are caused to perform a sweep operation (that is, the number of sweep modules 20 which are to be connected to the main line 7) out of five sweep modules 20 included in one string 10 is four. The VH command value, the voltage Vmod of each battery module 30, and the delay time DL are the same as in the example illustrated in FIG. 3. In the example illustrated in FIG. 4, the period T of the gate signal GS is "2.4 μsec×4=9.6 82 sec." The duty ratio of the gate signal GS is about 0.58.

As illustrated in FIG. 4, when some sweep modules 20 (the sweep module 20 of No. 2 in FIG. 4) are caused to perform a forcible through operation, the number P of sweep modules 20 which are caused to perform a sweep operation is less than that in the example illustrated in FIG. 3. However, the string 10 adjusts the period T of the gate signal GS and the duty ratio of the gate signal GS with the decrease in the number P of sweep modules 20 which are caused to perform a sweep operation. As a result, the waveform of the voltage VH which is output to the power distribution device 5 is the same as the waveform of the voltage VH illustrated in FIG. 3. Accordingly, the string 10 can appropriately output the commanded voltage VH to the power distribution device 5 even when the number P of sweep modules 20 which are caused to perform a sweep operation is increased or decreased.

For example, when a defect (for example, deterioration or failure) occurs in a battery 31 in a certain sweep module 20, the string 10 can cause the sweep module 20 including the battery 31 in which a defect has occurred to perform a forcible through operation. Accordingly, the string 10 can appropriately output the commanded voltage VH to the power distribution device 5 using the sweep modules 20 in which a defect has not occurred. An operator can replace the battery module 30 including the battery 31 in which a defect has occurred (that is, the battery module 30 of the sweep module 20 which is performing a forcible through operation) in a state in which the string 10 is operating normally. In other words, in the power supply system 1 according to this embodiment, it is not necessary to stop the operation of the string 10 as a whole when a battery module 30 is replaced.

When a certain sweep module 20 is caused to perform a forcible connection operation, the connection state of the sweep module 20 which is caused to perform a forcible connection operation is a normally connected state. For example, when the sweep module 20 of No. 2 in FIG. 4 is caused to perform a forcible connection operation instead of a forcible through operation, the connection state of No. 2 is maintained in a "connected state" instead of a "disconnected state."

When the power supply system 1 includes a plurality of strings 10, the above-mentioned sweep control is executed in each of the plurality of strings 10. The controller (the GCU 2 in this embodiment) that comprehensively controls the power supply system 1 as a whole controls the operations of the plurality of strings 10 such that a command from the host system 6 is satisfied. For example, when a VH command value required from the host system 6 cannot be satisfied by only one string 10, the GCU 2 may satisfy the VH command value by causing the plurality of strings 10 to output electric power.

String

The entire configurations of the string 10 and the power supply system 1 will be described below in detail with reference to FIG. 1. As described above, the string 10 includes an SCU 11 and a plurality of sweep modules 20 that is connected in series to the main line 7 with a power circuit module 40 interposed therebetween. The main line 7 of the string 10 is connected to a bus line 9 extending from the power distribution device 5. The string 10 includes a bus line voltage detecting unit 21, a system breaker (this system breaker is appropriately referred to as a "system main relay (SMR)") 22, a string capacitor 23, a string current detecting unit 24, a string reactor 25, and a string voltage detecting unit 26 sequentially from the power distribution device 5 side (upstream) in the main line 7. Disposition of some members may be modified. For example, the system breaker 22 may be provided downstream from the string capacitor 23.

The bus line voltage detecting unit 21 detects a voltage of the bus line 9 extending from the power distribution device 5 to the string 10. The system breaker 22 switches between connection and disconnection between the string 10 and the power distribution device 5. In this embodiment, the system breaker 22 is driven in accordance with a signal which is input from the SCU 11. The string capacitor 23 and the string reactor 25 form an RLC filter to achieve equalization of a current. The string current detecting unit 24 detects a current flowing between the string 10 and the power distribution device 5. The string voltage detecting unit 26 detects a total voltage of voltages of the plurality of sweep modules 20 which is connected in series to the main line 7 in the string 10, that is, a string voltage of the string 10.

In the example illustrated in FIG. 1, the system breaker 22 includes a switch 22a and a fuse 22b. The switch 22a is a device that connects or disconnects the string 10 to and from the power distribution device 5. The switch 22a can be appropriately referred to as a string switch. By turning on the switch 22a, the main line 7 of the string 10 is connected to the bus line 9 of the power distribution device 5. By turning off the switch 22a, the string 10 is disconnected from the power distribution device 5. The switch 22a is controlled by the SCU 11 controlling the string 10. By operating the switch 22a, the string 10 can be appropriately disconnected from or connected to the power distribution device 5. The fuse 22b is a device that stops an unexpected large current when the large current flows in the main line 7 of the string 10 in view of design of the string 10. The fuse 22b is also appropriately referred to as a string fuse.

Here, when batteries incorporated into one battery module 30 have the same standard, the voltage of one battery module 30 increases as the number of batteries incorporated increases. On the other hand, when the voltage of one battery module 30 is high, the battery module is dangerous for an operator to handle and is heavy. In this regard, as many batteries as possible may be incorporated into one battery module 30 within a range of a voltage with which an operator will not be subjected to a significant accident even with touch of the operator with the fully charged battery module (for example, lower than 60 V and preferably lower than 42 V) and within a range of a weight with which an operator can easily replace the battery module. The battery module 30 which is incorporated into the string 10 does not need to include the same batteries, and the number of batteries which are incorporated into one battery module 30 can be determined depending on types, standards, or the like of the batteries which are incorporated into the battery module 30. The string 10 is configured to output a necessary voltage by combining sweep modules 20 into which the battery module 30 has been incorporated in series. The power supply system 1 is configured to output electric power required for connection to the power system 8 by combining a plurality of strings 10.

In this embodiment, the power distribution device 5 to which a plurality of strings 10 of the power supply system 1 is connected includes sub power distribution devices 5A and 5B that are connected to the strings 10A and 10B. The strings 10A and 10B connected to the sub power distribution devices 5A and 5B are connected in parallel via the sub power distribution devices 5A and 5B. The power distribution device 5 controls distribution of electric power which is input to the strings 10A and 10B from the power system 8, combination of electric power which is output from the strings 10A and 10B to the power system 8, and the like through the sub power distribution devices 5A and 5B connected to the strings 10. The power distribution device 5 and the sub power distribution devices 5A and 5B are controlled such that the power supply system 1 into which a plurality of strings 10 is incorporated serves as a single power supply device as a whole by cooperation between the GCU 2 connected to the host system 6 and the SCU 11 that controls each string 10.

For example, in this embodiment, a downstream side from the power distribution device 5, that is, the strings 10A and 10B side, is controlled with a direct current. An upstream side from the power distribution device 5, that is, the power system 8, is controlled with an alternating current. The voltages of the strings 10A and 10B are controlled to be roughly balanced with the voltage of the power system 8 via the power distribution device 5. When the voltage of each of the strings 10A and 10B is controlled to be lower than that of the power system 8, a current flows from the power system 8 to each of the strings 10A and 10B. At this time, when sweep control is executed in the strings 10A and 10B, the battery modules 30 are appropriately charged. When the voltage of each of the strings 10A and 10B is controlled to be higher than that of the power system 8, a current flows from each of the strings 10A and 10B to the power system 8. At this time, when sweep control is executed in the strings 10A and 10B, the battery modules 30 are appropriately discharged. The power distribution device 5 may maintain the voltages of the strings 10A and 10B to be equal to the voltage of the power system 8 such that a current hardly flows in the strings 10A and 10B. In this embodiment, this control can be executed for each of the sub power distribution devices 5A and 5B to which the strings 10A and 10B are connected. For example, by adjusting the voltage for each of the strings 10A and 10B, control may be executed such that a current hardly flows in some string 10 out of a plurality of strings 10A and 10B connected to the power distribution device 5.

In the power supply system 1, the total capacity of the power supply system 1 can be increased by increasing the number of strings 10 which are connected in parallel to the power distribution device 5. For example, with the power supply system 1, it is possible to construct a large system that can output electric power such that a sudden increase in demand in the power system 8 can be absorbed or can supplement sudden power shortage in the power system 8. For example, by increasing the capacity of the power supply system 1, great surplus electric power of the power system 8 can be appropriately transferred to charging of the power supply system 1. For example, when output power of a power plant is surplus in a night time zone in which demand for electric power is low or when an amount of electric power generated in a large photovoltaic system increases suddenly, the power supply system 1 can absorb surplus electric power via the power distribution device 5. On the other hand, when demand for electric power in the power system 8 increases suddenly, necessary electric power can be appropriately output from the power supply system 1 to the power system 8 via the power distribution device 5 in accordance with a command from the host system 6. Accordingly, with the power supply system 1, power shortage in the power system 8 is appropriately supplemented.

In the power supply system 1, it is not necessary to normally connect all battery modules 30 out of a plurality of battery modules 30 which is incorporated into a string 10. Since a forcible through operation can be performed for each battery module 30 as described above, a battery module 30 in which a defect has occurred can be disconnected from sweep control of the string 10 when a defect has occurred in the battery module 30. Accordingly, in the power supply system 1, a battery which is used for the battery module 30 does not need to be a new battery which has not been used.

For example, a secondary battery which has been used as a driving power source of a motor-driven vehicle such as a hybrid vehicle or an electric vehicle can be appropriately reused. Even when such a secondary battery which has been used as a driving power source is used, for example, for about 10 years, the secondary battery can satisfactorily perform a secondary battery function. In the power supply system 1, since a battery module 30 in which a defect has occurred can be immediately disconnected, a battery can be incorporated into the battery module 30, for example, by ascertaining that the battery performs a necessary function. The time for sequentially recovering a secondary battery which has been used as a driving power source of a motor-driven vehicle comes up. With the power supply system 1, for example, secondary batteries corresponding to 10,000 motor-driven vehicles may be incorporated thereinto and thus considerable recovered secondary batteries can be absorbed. It cannot be seen when a secondary battery which has been used as a driving power source of a motor-driven vehicle deteriorates in performance. When such a secondary battery is reused for a battery module 30 of the power supply system 1, it is not possible to predict when a defect occurs in the battery module 30.

With the power supply system 1 which has been proposed herein, it is possible to appropriately disconnect a battery module 30 via a sweep module 20. Accordingly, even when a defect occurs suddenly in a battery module 30 or a secondary battery incorporated into the battery module 30, it is not necessary to stop the power supply system 1 as a whole.

Number of Sweep Modules in String

The number of sweep modules 20 in a string 10 in this embodiment (that is, the number of sweep modules 20 connected to one main line 7) will be described below. A string 10 in this embodiment includes sweep modules 20 of which the number of sweep modules 20 is larger S (S≥2) than a minimum number Mmin of sweep modules 20 required for operation (operation based on sweep control illustrated in FIGS. 3 and 4 in this embodiment). Accordingly, when the number of sweep modules 20 with a defect (for example, failure and deterioration of the battery module 30) occurring therein (hereinafter referred to as "defective sweep modules") is equal to or less than S, the string 10 can operate normally. The minimum number Mmin of sweep modules 20 in the string 10 can be appropriately set depending on various conditions (for example, at least one of the VH command value commanded from the host system and the number of strings 10 included in the power supply system 1). The minimum number Mmin may be automatically set by a control unit (for example, the SCU 11) or may be set in accordance with an operator's instruction. The minimum number Mmin may be appropriately changed depending on various situations.

Power Supply Control Process Routine

In a power supply control process routine, a process of appropriately replacing a battery module 30 with a defect occurring therein is performed while performing sweep control in one string 10. The power supply control process routine which is performed by the power supply system 1 according to this embodiment will be described below with reference to FIG. 5.

The power supply control process routine which is described in this embodiment is performed by the SCU 11 which is a controller (a control unit) of the string 10. When a sweep control start instruction in the string 10 is input from the GCU 2, the SCU 11 starts the power supply control process routine illustrated in FIG. 5. The controller that performs the power supply control process routine is not limited to the SCU 11. For example, the GCU 2 may perform the power supply control process routine or a controller that performs the power supply control process routine may be provided other than the SCU 11 and the GCU 2. A plurality of controllers (for example, the SCU 11 and a plurality of sweep units 50) may perform the power supply control process routine in cooperation with each other.

When the power supply control process routine is started, the SCU 11 sets conditions of sweep control (S1). For example, when electric power is output from the power supply system 1 to the power distribution device 5, a VH command signal for instructing a voltage VH which is output to the power distribution device 5 is input to the SCU 11 from the GCU 2 which is the above-mentioned controller. As described above, the SCU 11 sets conditions of sweep control such as the delay time DL and the period T of a gate signal GS based on a VH command value indicated by the VH command signal, the voltage Vmod of each battery module 30, the number P of sweep modules 20 which are to be connected to the main line 7 in sweep control, and the like. The SCU 11 starts sweep control based on the set conditions (S2).

The SCU 11 determines whether a new defect has been detected in one of the plurality of sweep modules 30 included in the string 10 (S4). For example, the SCU 11 in this embodiment detects a defect such as failure or deterioration of a battery 31 in a battery module 30 for each battery module 30 using the voltage detecting unit 35 and the temperature detecting unit 36 which are provided for each battery module 30 (see FIG. 2). Signals indicating results of detection from the voltage detecting unit 35 and the temperature detecting unit 36 are output to the SCU 11 via the sweep unit 50 (see FIG. 2). For example, when an abnormal voltage (for example, a voltage equal to or lower than a threshold value) has been detected by the voltage detecting unit 35, a defect of the battery module 30 is detected. When an abnormal temperature (for example, a temperature equal to or higher than a threshold value) has been detected by the temperature detecting unit 36, a defect of the battery module 30 is detected. The SCU 11 in this embodiment detects a defect of the switching elements 41 and 42 or the like in the power circuit module 40 using the temperature detecting unit 48 which is provided for each power circuit module 40. When a new defect has not been detected in any battery module 30 (S4: NO), the routine progresses to S12.

When a new defect has been detected in any one of a plurality of sweep modules 20 (S4: YES), the SCU 11 causes the indicator 57 to indicate the sweep module 20 in which a defect has been detected (hereinafter referred to as a "defective sweep module") (S5). That is, the SCU 11 notifies an operator of the defective sweep module using the indicator 57. For example, the SCU 11 in this embodiment outputs a signal for instructing to drive the indicator 57 to the defective sweep module. As a result, an operator is notified of the defective sweep module. Specifically, the SCU 11 changes a method of indicating a defective sweep module using the indicator 57 depending on the type of the detected defect. For example, when deterioration, failure, or the like of a battery module 30 has been detected and when failure or the like of a power circuit module 40 has been detected, the SCU 11 changes an emission mode of the indicator 57 which is an LED. Accordingly, an operator can also easily ascertain a type of a defect.

Subsequently, the SCU 11 determines whether the number of defective sweep modules out of a plurality of sweep modules 20 in the string 10 is equal to or lower than F (S7). Here, the value of F is set to be equal to greater than 2. The value of F is set to a value which is equal to or less than a difference S between the number M of sweep modules 20 in the string 10 and the minimum number Mmin of sweep modules 20 required for operation of the string 10. That is, the value of F is set such that the minimum number Mmin of sweep modules 20 is secured even when a defect occurs in F (F≥2) battery modules 30.

The value of F may be automatically set by a control unit (for example, the SCU 11) based on the minimum number Mmin or the like. The value of F may be set in accordance with an operator's instruction. The value of F may be appropriately changed depending on various situations.

When the number of defective sweep modules in the string 10 is greater than F (S7: NO), the SCU 11 stops sweep control in the string 10 (S19) and ends the routine. Accordingly, a likelihood that the string 10 will inappropriately operate in a state in which the number of normal sweep modules 20 is small decreases.

When the number of defective sweep modules in the string 10 is equal to or less than F (S7: YES), the SCU 11 can perform maintenance of the defective sweep modules (for example, replacement of the battery module 30 with a defect occurring therein) in a state in which sweep control of the string 10 as a whole is maintained. Specifically, the SCU 11 outputs the above-mentioned forcible through signal SSC to a defective sweep module and disconnects the battery module 30 in the defective sweep module from the main line 7 (S8). The SCU 11 excludes the defective sweep module from objects which are to be connected to the main line 7 in sweep control (S9). The SCU 11 excludes the defective sweep modules from connection objects, resets conditions of sweep control, and continuously performs sweep control under the reset conditions (S10).

As described above, the value of F is set such that the minimum number Mmin of sweep modules 20 required for operation is secured even when a defect occurs in F (F≥2) sweep modules 20. Accordingly, by performing the processes of S8 to S10, it is possible to perform maintenance of defective sweep modules in a state in which sweep control of the string 10 as a whole is appropriately maintained. The value of F is set to be equal to or greater than 2. Accordingly, until the number of defective sweep modules in the string 10 is greater than F (F≥2), maintenance of the defective sweep modules can be performed at any time in a state in which sweep control of the string 10 is maintained. Accordingly, the frequency of execution of maintenance of defective sweep modules can be appropriately decreased.

An operator can appropriately ascertain a defective sweep module using the indicator 57 and perform appropriate maintenance of the defective sweep module (for example, replacement of a battery module 30). Accordingly, for example, the likelihood that a normal battery module 30 will be erroneously replaced or the like decreases. When the detected defect is failure of a battery 31 or the like, the voltage of the battery 31 which is to be replaced (a battery 31 in one battery module 30 in this embodiment) is curbed to be a lower value in comparison with the case in which all batteries 31 included in the string 10 are replaced, and thus it is possible to easily secure safety. In comparison with the case in which all batteries 31 included in the string 10 are replaced, it is possible to further enhance work efficiency.

Subsequently, the SCU 11 determines whether correction of a defect of a defective sweep module has been detected (S12). That is, in S12, it is determined whether appropriate maintenance has been performed on a defective sweep module in which a defect has been detected in S4 and which has been disconnected from the main line 7 to correct the defect. For example, in this embodiment, when the detected defect is failure of the battery module 30 or the like, the voltage detecting unit 35 (see FIG. 2) provided for each battery module 30 detects that the battery module 30 of which the defect has been detected has been replaced with another battery module 30. When the detected defect is failure of the power circuit module 40 or the like, the temperature detecting unit 48 of the power circuit module 40 or the like detects that the defect of the power circuit module 40 has been corrected. When correction of a defect is not detected (S12: NO), the routine progresses to S16.

When correction of a defect of the defective sweep module is detected (S12: YES), the SCU 11 ends indication of the defective sweep module which the indicator 57 is caused to perform (that is, notification of an operator of the defective sweep module) (S13). Accordingly, an operator can easily ascertain that maintenance of the defective sweep module has been appropriately completed. The SCU 11 adds the sweep module 20 of which the defect has been corrected to the objects which are to be connected to the main line 7 in sweep control (S14). The SCU 11 adds the connection objects, resets conditions of sweep control, and executes sweep control under the reset conditions (S15). Accordingly, in a state in which the sweep module 20 of which the defect has been corrected is added, supply of electric power between the string 10 and the power distribution device 5 is appropriately performed.

The process of adding the sweep module 20 of which the defect has been corrected to the objects which are to be connected to the main line 7 in sweep control does not need to be performed immediately after correction of a defect has been detected. For example, the SCU 11 may add the sweep module 20 to the connection objects after the voltage of the battery module 30 in the sweep module 20 of which the defect has been corrected has been adjusted.

Subsequently, the SCU 11 performs various processes (S16). For example, when the VH command value which is output to the power distribution device 5 has changed, the SCU 11 resets the conditions of sweep control based on the changed VH command value. Subsequently, the SCU 11 determines whether an instruction to end sweep control has been input (S18). When an instruction has not been input (S18: NO), the routine returns to S4 and sweep control is continuously executed. When an end instruction has been input (S18: YES), the SCU 11 stops sweep control in the string 10 (S19) and ends the routine.

The technique disclosed in the above-mentioned embodiment is only an example. Accordingly, the technique described in the embodiment may be modified. For example, in the embodiment, a defect is detected for each sweep module 20 by the voltage detecting unit 35, the temperature detecting unit 36, and the temperature detecting unit 48 (see FIG. 2). That is, the voltage detecting unit 35, the temperature detecting unit 36, and the temperature detecting unit 48 in this embodiment are an example of a defect detecting unit that detects a defect for each sweep module 20. However, the specific configuration of the defect detecting unit may be modified. For example, the control unit (the SCU 11 in this embodiment) may connect a plurality of sweep modules 20 in a string 10 to one main line 7 one by one. The control unit may detect a defect for each battery module 30 by acquiring the voltage of the battery module 30 in the connected sweep module 20 from the string voltage detecting unit 26 (see FIG. 1).

The voltage detecting unit 35 in this embodiment is an example of a defect correction detecting unit that detects that a battery module 30 in which a defect has been detected is replaced (that is, correction of the defect of the battery module 20). However, the specific configuration of the defect correction detecting unit may be modified. For example, an attachment/detachment sensor (for example, a proximity sensor) that detects detachment and attachment of a battery module 30 from and to the power circuit module 40 may be provided for each sweep module 20. In this case, the attachment/detachment sensor may be used as the defect correction detecting unit.

Figure 5:
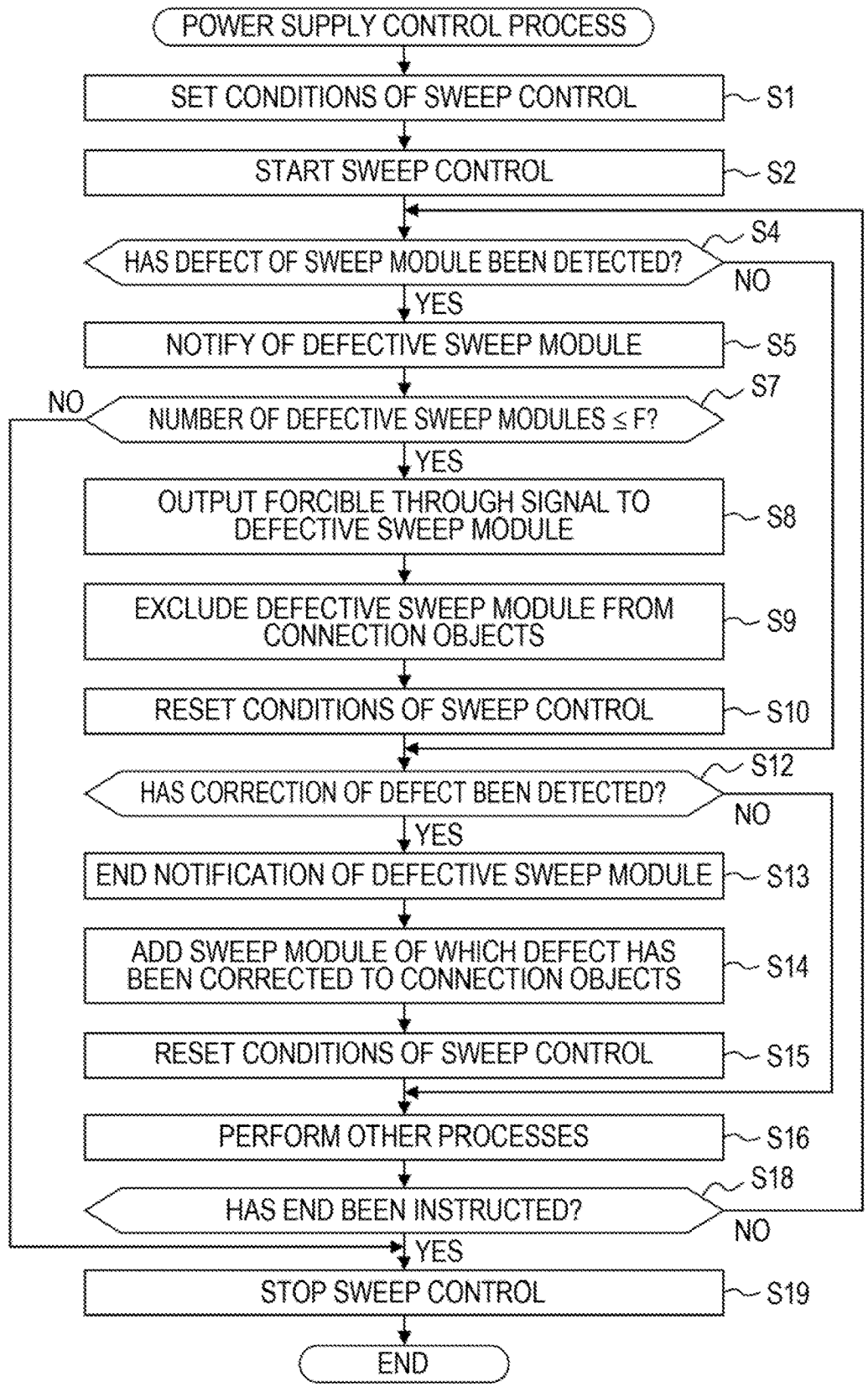
FIG. 5 is a flowchart illustrating a power supply control process which is performed in the power supply system 1.

The process of executing sweep control in S2 of FIG. 5 is an example of a "first process." In S7 to S10 of FIG. 5, the process of continuously executing sweep control while disconnecting a defective sweep module from the main line 7 is an example of a "second process." In S7 and S19 of FIG. 5, the process of stopping sweep control when the number of defective sweep modules is greater than F is an example of a "third process." The process of causing the indicator 57 to indicate a defective sweep module in S5 of FIG. 5 is an example of a "fourth process."

While a specific embodiment of the disclosure has been described above in detail, the embodiment is only an example and does not limit the appended claims. The technique described in the claims includes various modifications and changes of the above-mentioned embodiment.

What is claimed is:

1. A power supply system comprising:
a main line;
a plurality of sweep modules that is connected to the main line;
a defect detecting unit; and
a control unit,
wherein each sweep module includes
a battery module that includes at least one battery, and
a power circuit module that includes at least one switching element that switches between connection and disconnection between the battery module and the main line,
wherein the defect detecting unit is configured to detect a defect for each sweep module,
wherein the sweep modules which are more S (S≥2) than a minimum number of sweep modules required for operation are connected to the main line, and
wherein the control unit is configured to perform
a first process of executing sweep control for sequentially switching the battery modules which are to be connected to the main line out of the plurality of battery modules by outputting a gate signal for controlling the switching element to the power circuit module, and a second process of excluding a sweep module in which a defect has been detected from the plurality of sweep modules and continuously executing the sweep control while maintaining disconnection of a sweep module in which a defect has been detected from the main line when the number of sweep modules in which a defect has been detected by the defect detecting unit out of the plurality of sweep modules connected to the main line is equal to or less than F ($2 \leq F \leq S$).

2. The power supply system according to claim 1, wherein the control unit is configured to perform a third process of stopping the sweep control when the number of sweep modules in which a defect has been detected by the defect detecting unit out of the plurality of sweep modules connected to the main line is greater than F.

3. The power supply system according to claim 1, further comprising an indicator configured to indicate a sweep module in which a defect has been detected, wherein the control unit is configured to perform a fourth process of causing the indicator to indicate a sweep module in which a defect has been detected by the defect detecting unit.

* * * * *